(12) United States Patent
Wang et al.

(10) Patent No.: US 11,996,031 B2
(45) Date of Patent: May 28, 2024

(54) CONTROL METHOD OF DISPLAY MODULE, DISPLAY MODULE AND DISPLAY DEVICE

(71) Applicants: Beijing BOE Sensor Technology Co., Ltd., Beijing (CN); BOE Technology Group Co., Ltd., Beijing (CN)

(72) Inventors: Yongbo Wang, Beijing (CN); Chen Meng, Beijing (CN); Jing Yu, Beijing (CN); Xiaotian Pang, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 192 days.

(21) Appl. No.: 17/635,180

(22) PCT Filed: Apr. 29, 2021

(86) PCT No.: PCT/CN2021/091065
§ 371 (c)(1),
(2) Date: Feb. 14, 2022

(87) PCT Pub. No.: WO2022/226907
PCT Pub. Date: Nov. 3, 2022

(65) Prior Publication Data
US 2023/0343272 A1    Oct. 26, 2023

(51) Int. Cl.
*H01L 25/16* (2023.01)
*G09G 3/20* (2006.01)
*H02S 99/00* (2014.01)

(52) U.S. Cl.
CPC ............. *G09G 3/2096* (2013.01); *G09G 3/20* (2013.01); *G09G 2320/02* (2013.01);
(Continued)

(58) Field of Classification Search
CPC .... G09G 3/2096; G09G 3/20; G09G 2320/02; G09G 2320/0626; G09G 2360/144; H01L 25/167; H02S 99/00
See application file for complete search history.

(56) References Cited

U.S. PATENT DOCUMENTS 3,742,222 A * 6/1973 Endl ................... F16P 3/144
250/221
8,773,450 B2 * 7/2014 Harris ................. G09G 3/002
348/602

(Continued)

FOREIGN PATENT DOCUMENTS

| CN | 1645446 A | 7/2005 |
| CN | 106297679 A | 1/2017 |

(Continued)

*Primary Examiner* — Amy Onyekaba
(74) *Attorney, Agent, or Firm* — IPro, PLLC

(57) ABSTRACT

A control method of a display module, a display module, and a display device. The display module comprises: a transparent display panel (11) comprising an active area and a peripheral area, wherein the transparent display panel (11) has a display side; a dimming panel (12) disposed at a side of the transparent display panel (11) away from the display side; a light-intensity detection unit comprising a photosensitive sensor (13), wherein the photosensitive sensor (13) is disposed at a side of the transparent display panel (11) away from the display side and disposed corresponding to the peripheral area, and the light-intensity detection unit is configured to detect an incident-light intensity of an incident light; and a control unit (14) connected to the light-intensity detection unit and the dimming panel (12), respectively, and configured to adjust a transmittance of the dimming panel (12) according to the incident-light intensity.

19 Claims, 7 Drawing Sheets

(52) U.S. Cl.
CPC ............... *G09G 2320/0626* (2013.01); *G09G 2360/144* (2013.01); *H01L 25/167* (2013.01); *H02S 99/00* (2013.01)

(56) References Cited

U.S. PATENT DOCUMENTS

| | | | | |
|---|---|---|---|---|
| 10,688,915 | B1* | 6/2020 | Rastoll | B60Q 1/28 |
| 10,775,632 | B1* | 9/2020 | Chapalamadugu | G02B 6/4203 |
| 2005/0122053 | A1* | 6/2005 | Ko | H10K 59/50 |
| | | | | 315/169.3 |
| 2007/0146356 | A1* | 6/2007 | Ladouceur | G09G 3/36 |
| | | | | 345/207 |
| 2010/0097469 | A1* | 4/2010 | Blank | H10K 59/65 |
| | | | | 359/872 |
| 2014/0307008 | A1* | 10/2014 | Delfs | G09G 3/3406 |
| | | | | 345/690 |
| 2014/0313218 | A1* | 10/2014 | Lee | G09G 5/10 |
| | | | | 345/589 |
| 2018/0188538 | A1* | 7/2018 | Bell | G02F 1/13306 |
| 2018/0350310 | A1* | 12/2018 | Xiao | G09G 3/36 |
| 2019/0056615 | A1* | 2/2019 | Chen | G09G 3/3611 |
| 2019/0080664 | A1* | 3/2019 | Li | G09G 3/3433 |
| 2020/0211480 | A1* | 7/2020 | Xiang | G09G 3/3406 |
| 2022/0051643 | A1* | 2/2022 | Yamada | G02B 27/0101 |
| 2022/0107517 | A1* | 4/2022 | Yaroshchuk | G02B 27/0977 |
| 2022/0283432 | A1* | 9/2022 | Richards | B60K 35/00 |
| 2022/0302223 | A1* | 9/2022 | Shi | H10K 59/65 |
| 2022/0334423 | A1* | 10/2022 | Lin | G02F 1/13324 |
| 2023/0062373 | A1* | 3/2023 | Ono | G02F 1/13 |

FOREIGN PATENT DOCUMENTS

| | | |
|---|---|---|
| CN | 106842737 A | 6/2017 |
| CN | 111045263 A | 4/2020 |

\* cited by examiner

CONTROL METHOD OF DISPLAY MODULE, DISPLAY MODULE AND DISPLAY DEVICE

TECHNICAL FIELD

The present disclosure relates to the technical field of display, and in particularly relates to a control method for a display module, a display module, and a display device.

BACKGROUND

Since the transparent display screen can transmit light like glass or display images like a screen, it has a large market space in application fields such as car window display.

For the application scenario where a transparent display screen is installed on a subway window, when the subway travels from the underground to the ground, the external light becomes strong, which reduces the display contrast of the transparent display screen and the display effect becomes worse.

SUMMARY

The embodiments of the present disclosure provide a display module, the display module comprises:
a transparent display panel comprising an active area and a peripheral area located on a periphery of the active area, wherein the transparent display panel has a display side;
a dimming panel disposed at a side of the transparent display panel away from the display side;
a light-intensity detection unit comprising a photosensitive sensor, wherein the photosensitive sensor is disposed at a side of the transparent display panel away from the display side and disposed corresponding to the peripheral area, and the light-intensity detection unit is configured to detect an incident-light intensity of an incident light; and
a control unit connected to the light-intensity detection unit and the dimming panel, respectively, and configured to adjust a transmittance of the dimming panel according to the incident-light intensity.

In an optional implementation, the photosensitive sensor is disposed at a side of the dimming panel away from the transparent display panel; or, the photosensitive sensor is disposed at a side of the dimming panel close to the transparent display panel.

In an optional implementation, the photosensitive sensor is a photoresistor, and the light-intensity detection unit further comprises: a first voltage divider element, a shunt element, an amplifier element, and a first analog-to-digital conversion element;
wherein, a first end of the photoresistor is connected in series with the first voltage divider element, a second end is connected to a first reference voltage terminal; the shunt element is connected in parallel with the photoresistor; a non-inverting input end of the amplifier element is connected to the first end of the photoresistor, an inverting input end is connected to a first node; and the first analog-to-digital conversion element is connected to the first node and the control unit, respectively; and
the first voltage divider element, the shunt element, the amplifier element, the first analog-to-digital conversion element, and the control unit are integrated on a printed circuit board of the display module.

In an optional implementation, the photosensitive sensor is a phototriode, and the light-intensity detection unit further comprises: a second voltage divider element and a second analog-to-digital conversion element;
wherein, a first pole of the phototriode is connected to a second reference voltage terminal, a second pole is connected to the second voltage divider element and the second analog-to-digital conversion element, respectively; and the second analog-to-digital conversion element is further connected to the control unit; and
the phototriode, the second voltage divider element, and the second analog-to-digital conversion element are integrated on a photo inductance control board of the display module, and the photo inductance control board and the peripheral area are disposed correspondingly.

In an optional implementation, the photosensitive sensor is a photodiode, the light-intensity detection unit comprises a photo inductance integrated chip, the photodiode is disposed on the photo inductance integrated chip, and the photo inductance integrated chip and the peripheral area are disposed correspondingly.

In an optional implementation, the light-intensity detection unit and the control unit are connected via a RS485 or a LIN bus.

In an optional implementation, the control unit comprises:
an arithmetic element, configured to determine a target transmittance of the dimming panel according to the incident-light intensity; and
a control element, configured to output a control signal to the dimming panel according to the target transmittance;
wherein, the arithmetic element and the control element are connected via a RS232 interface.

In an optional implementation, the display module further comprises:
a first glass plate disposed at sides of the dimming panel and the photosensitive sensor away from the display side; and
a solar cell panel disposed at a side of the first glass plate away from the transparent display panel, disposed corresponding to the peripheral area, and configured to receive sunlight and convert a luminous energy of the sunlight into an electric energy, wherein the electric energy is used to power at least one of the followings: the transparent display panel, the dimming panel, the light-intensity detection unit, and the control unit.

In an optional implementation, the display module further comprises:
a first glass plate disposed at sides of the dimming panel and the photosensitive sensor away from the display side;
a second glass plate disposed at a side of the transparent display panel close to the display side;
a first metal electrode disposed at a side of the first glass plate close to the dimming panel, and disposed corresponding to the peripheral area;
a second metal electrode disposed at a side of the second glass plate close to the transparent display panel, and disposed corresponding to the peripheral area; and
a temperature difference power generation sheet connected to the first metal electrode and the second metal electrode, respectively, disposed corresponding to the peripheral area, and configured to generate electric energy according to a temperature difference between the first metal electrode and the second metal electrode, wherein the electric energy is used to power at least one of the followings: the transparent display panel, the dimming panel, the light-intensity detection unit, and the control unit.

The present disclosure provides a display device, and the display device comprises the above-mentioned display module.

In an optional implementation, the display device is a window or a vehicle.

The present disclosure provides a control method of a display module, wherein the control method is applied to the above-mentioned display module, and the control method comprises:

acquiring the incident-light intensity detected by the light-intensity detection unit; and adjusting the transmittance of the dimming panel according to the incident-light intensity.

In an optional implementation, on the condition that the photosensitive sensor is disposed at a side of the dimming panel away from the transparent display panel, the step of adjusting the transmittance of the dimming panel according to the incident-light intensity comprises:

determining a target transmittance corresponding to the incident-light intensity, according to a pre-stored corresponding relationship between light intensities and transmittances; and outputting a control signal to the dimming panel according to the target transmittance.

In an optional implementation, on the condition that the photosensitive sensor is disposed at a side of the dimming panel close to the transparent display panel, the step of adjusting the transmittance of the dimming panel according to the incident-light intensity comprises:

on the condition that the incident-light intensity is greater than a first preset threshold, determining that the target transmittance of the dimming panel is less than a current transmittance of the dimming panel;

on the condition that the incident-light intensity is less than a second preset threshold, determining that the target transmittance is greater than the current transmittance;

on the condition that the incident-light intensity is less than or equal to the first preset threshold, and greater than or equal to the second preset threshold, determining that the target transmittance is the current transmittance; and outputting a control signal to the dimming panel according to the target transmittance.

In an optional implementation, the step of acquiring the incident-light intensity detected by the light-intensity detection unit comprises:

acquiring the incident-light intensity according to a pre-determined cycle.

In an optional implementation, before the step of acquiring the incident-light intensity detected by the light-intensity detection unit, the method further comprises:

acquiring a dimming instruction sent by a backstage administrator account, wherein the dimming instruction contains a specified transmittance; and adjusting the transmittance of the dimming panel to the specified transmittance in response to the dimming instruction;

the step of acquiring the incident-light intensity detected by the light-intensity detection unit comprises:

if the dimming instruction is not acquired, acquiring the incident-light intensity detected by the light-intensity detection unit.

In an optional implementation, before the step of acquiring the incident-light intensity detected by the light-intensity detection unit, the method further comprises:

acquiring information to be played; and outputting a drive signal to the transparent display panel, to drive the transparent display panel to display the information to be played.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work. It should be noted that the ratios in the drawings are merely illustrative and do not represent actual ratios.

DETAILED DESCRIPTION OF THE EMBODIMENTS

In order to make the objects, the technical solutions, and the advantages of the embodiments of the present disclosure clearer, the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
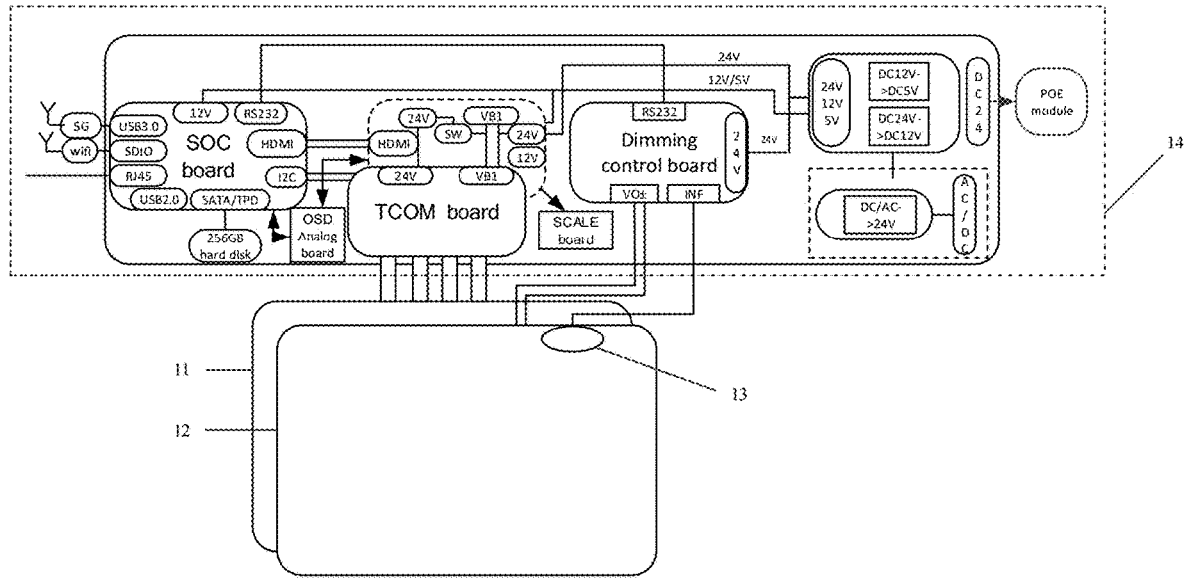
FIG. 1 illustrates a structural schematic diagram of a display module according to an embodiment of the present disclosure.

One embodiment of the present disclosure provides a display module, referring to FIG. 1, the display module may include: a transparent display panel 11, comprising an active area and a peripheral area located on a periphery of the active area, wherein the transparent display panel 11 has a display side; a dimming panel 12, disposed at a side of the transparent display panel 11 away from the display side; a light-intensity detection unit, comprising a photosensitive sensor 13, wherein the photosensitive sensor 13 is disposed at a side of the transparent display panel 11 away from the display side and disposed corresponding to the peripheral area, and the light-intensity detection unit is configured to detect an incident-light intensity of an incident light; and a control unit 14, connected to the light-intensity detection unit and the dimming panel 12, respectively, and configured to adjust a transmittance of the dimming panel 12 according to the incident-light intensity.

Wherein, the transparent display panel 11 may be a panel with an organic light-emitting diode (OLED) structure, or may be a panel with other structures, which is not limited in this embodiment. The display side of the transparent display panel 11 is the surface of the displaying field.

The dimming panel 12 may include a first substrate and a second substrate arranged in align with each other, and a dye liquid crystal filled between the first substrate and the second substrate. The first substrate and the second substrate may be provided with electrode structures, the electrode structures are used to form an electric field that controls the deflection of the dye liquid crystal. This embodiment does not limit the specific structure of the dimming panel. The control unit 14 may be connected to the electrode structure, and the transmittance of the dimming panel 12 may be adjusted by changing the voltage on the electrode structure.

In the embodiment, the photosensitive sensor 13 may be a photosensitive device such as a photoresistor, a photodiode, or a phototriode, which is not limited in this embodiment.

In a specific implementation, the control unit 14 may be disposed on a printed circuit board of the display module, and may be connected to the dimming panel 12 through a flexible printed circuit (FPC), which is not limited in this embodiment.

The connection mode between the control unit 14 and the light-intensity detection unit may be determined according to the specific structure type of the light-intensity detection unit, which may be described in detail in subsequent embodiments.

Figure 2:
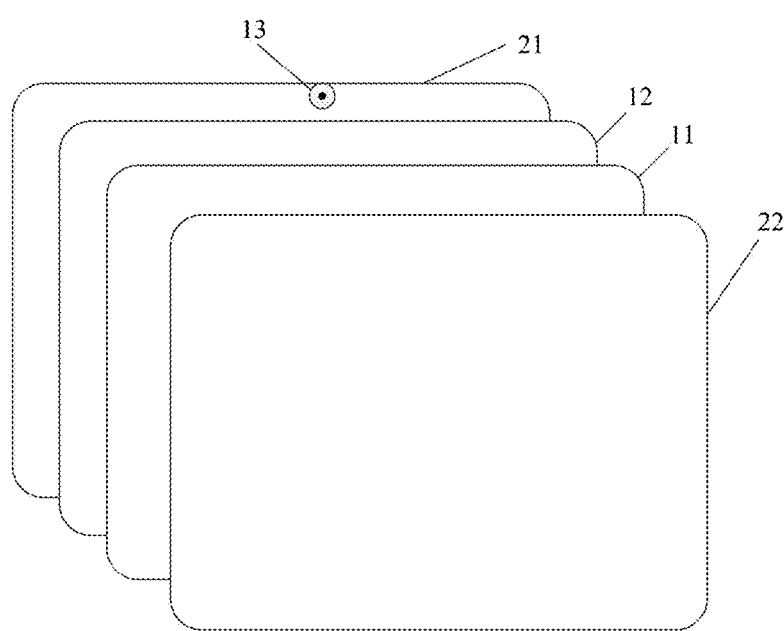
FIG. 2 illustrates a specific structural schematic diagram of a display module according to an embodiment of the present disclosure.

Referring to FIG. 2, the photosensitive sensor 13 may be disposed at a side of the dimming panel 12 away from the transparent display panel 11. As shown in FIG. 2, a first glass plate 21 may also be provided at a side of the dimming panel 12 away from the transparent display panel 11. In this case, the photosensitive sensor 13 is provided between the first glass plate 21 and the dimming panel 12.

Figure 3:
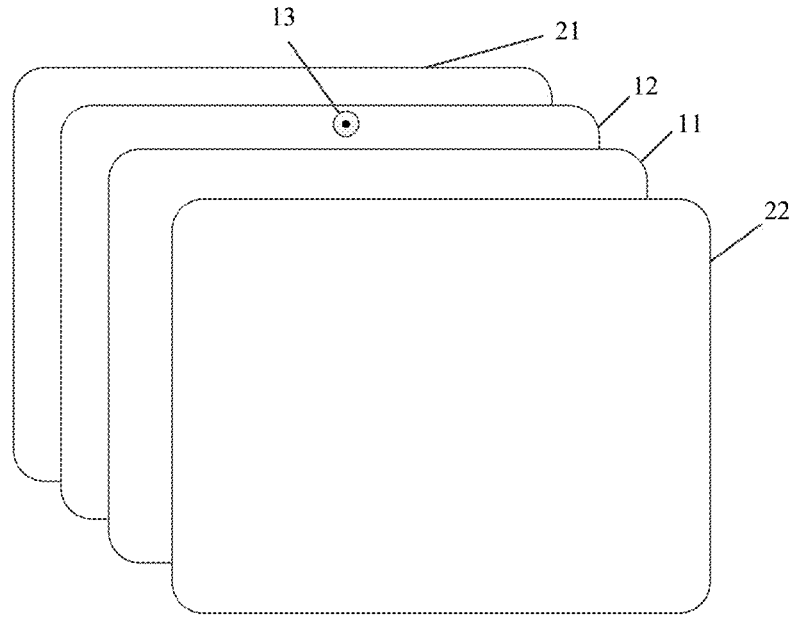
FIG. 3 illustrates a specific structural schematic diagram of another display module according to an embodiment of the present disclosure.

Referring to FIG. 3, the photosensitive sensor 13 may be disposed at a side of the dimming panel 12 close to the transparent display panel 11, that is, the photosensitive sensor 13 is disposed between the dimming panel 12 and the transparent display panel 11.

It should be noted that, the photosensitive sensor 13 only needs to be disposed at the back of the transparent display panel 11 (that is, the side face away from the display side), and the specific position of the photosensitive sensor 13 is not limited in this embodiment.

Referring to FIG. 2, when the photosensitive sensor 13 is disposed at the side of the dimming panel 12 away from the transparent display panel 11, the incident-light intensity detected by the light-intensity detection unit is equivalent to a light intensity of an external light incident on the dimming panel 12. In this case, the control unit 14 may specifically determine the target transmittance corresponding to the incident-light intensity according to the pre-stored corresponding relationship between the light intensities and the transmittances; then, it may output a control signal to the dimming panel 12 according to the target transmittance.

In a specific implementation, the light intensity may be divided into several levels firstly, and then the corresponding relationship between the light intensity of each level and the transmittance is established; then, according to the corresponding relationship, the target transmittance corresponding to the level of the incident-light intensity may be determined.

In this way, an external light intensity of the dimming panel 12 is obtained automatically by the light-intensity detection unit, and the transmittance of the dimming panel 12 is adjusted automatically according to the light intensity, to ensure that the light intensity of the external light passing through the dimming panel 12 and incident on the transparent display panel 11 is stable, which can avoid the change of the external light intensity from affecting the display contrast of the transparent display panel 11, thereby improving the stability of the display contrast.

Referring to FIG. 3, when the photosensitive sensor 13 is disposed at the side of the dimming panel 12 close to the transparent display panel 11, the incident-light intensity detected by the light-intensity detection unit is equivalent to the light intensity of the external light passing through the dimming panel 12 and incident on the transparent display panel 11. In this case, the specific process of the control unit 14 adjusting the transmittance of the dimming panel 12 according to the incident-light intensity may include:
on the condition that the incident-light intensity is greater than a first preset threshold, determining that the target transmittance of the dimming panel 12 is less than a current transmittance of the dimming panel 12; on the condition that the incident-light intensity is less than a second preset threshold, determining that the target transmittance is greater than the current transmittance; on the condition that the incident-light intensity is less than or equal to the first preset threshold, and greater than or equal to the second preset threshold, determining that the target transmittance is the current transmittance; and then outputting a control signal to the dimming panel 12 according to the target transmittance.

In a specific implementation, the transmittance of the dimming panel 12 may be adjusted according to the incident-light intensity through the PID algorithm, so that the incident-light intensity detected by the light-intensity detection unit is always within a predetermined interval, thereby forming a closed-loop control. Thereinto, the predetermined interval, that is, the incident-light intensity is less than or equal to the first preset threshold, and greater than or equal to the second preset threshold. The specific values of the first preset threshold and the second preset threshold may be set according to actual needs, which are not limited in the present disclosure.

In this way, no matter how the external luminance of the dimming panel 12 changes, it may ensure that the light intensity of the external light passing through the dimming panel 12 and incident on the transparent display panel 11 is stable, which may avoid the change of the external light intensity from affecting the display contrast of the transparent display panel 11, thereby improving the stability of the display contrast.

The display module provided by the embodiment, by disposing a photosensitive sensor at the back of the transparent display panel, may detect the incident-light intensity of the incident light on the back of the transparent display panel, and adjust the transmittance of the dimming panel according to the incident-light intensity. Moreover, since the dimming panel is disposed at the back of the transparent display panel, by adjusting the transmittance of the dimming panel, the intensity of the light incident on the transparent display panel can be ensured to remain stable, thereby improving the stability of the display contrast of the transparent display panel and meeting the display quality need.

Figure 4:
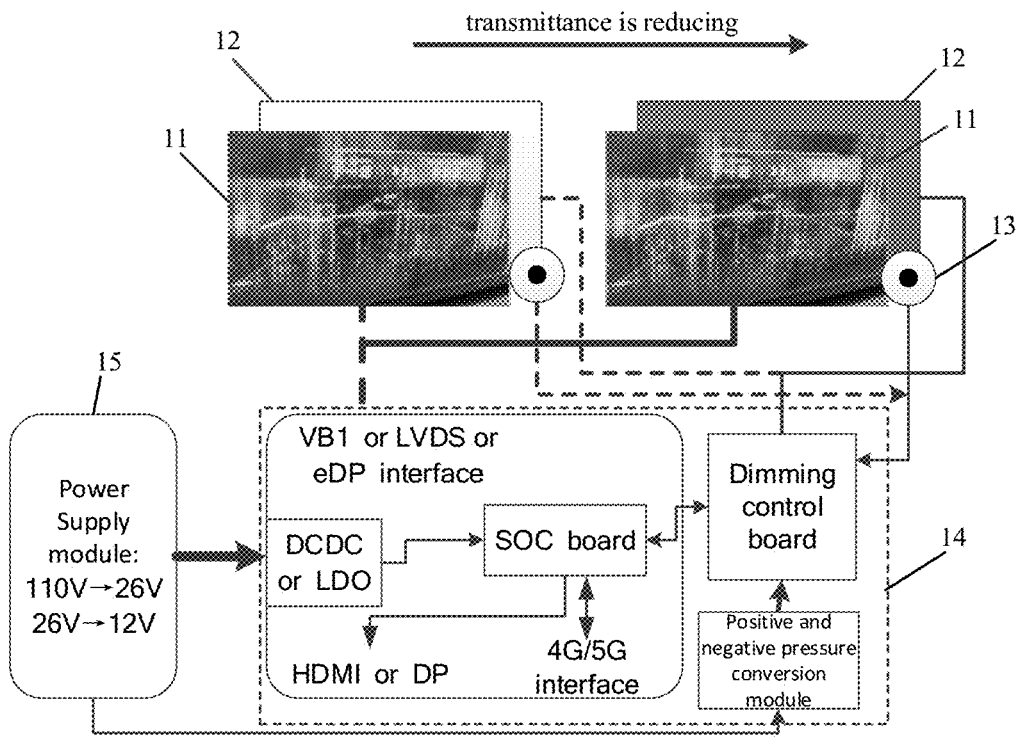
FIG. 4 illustrates a comparison schematic diagram of a display module switched from transparent state to dark state according to an embodiment of the present disclosure.

Referring to FIG. 4, which shows a schematic diagram of the dimming panel 12 in the display module being switched from a transparent state to a non-transparent state. This switching process corresponds to the change of the ambient light of the display module from weak to strong. In order to avoid the large external light intensity from affecting the display contrast of the transparent display panel 11, the transmittance of the dimming panel 12 is adjusted to lower.

It should be noted that, 4G, 5G, or wife interfaces may be provided on the control unit 14, as shown in FIG. 1 and FIG. 4. In this way, the control unit 14 may obtain a remote dimming instruction sent by the backstage administrator account in a wired or wireless mode. The remote dimming instruction may include, for example, a specified transmittance, and then the control unit 14 may preferentially adjust the transmittance of the dimming panel 12 according to the specified transmittance.

The display module provided in the embodiment may also include a power supply module 15. As shown in FIG. 4, the power supply module 15 may convert the vehicle power supply into a power signal required by the display module. The power supply module 15 may be provided with a circuit for preventing lightning strikes and surges.

Figure 5:
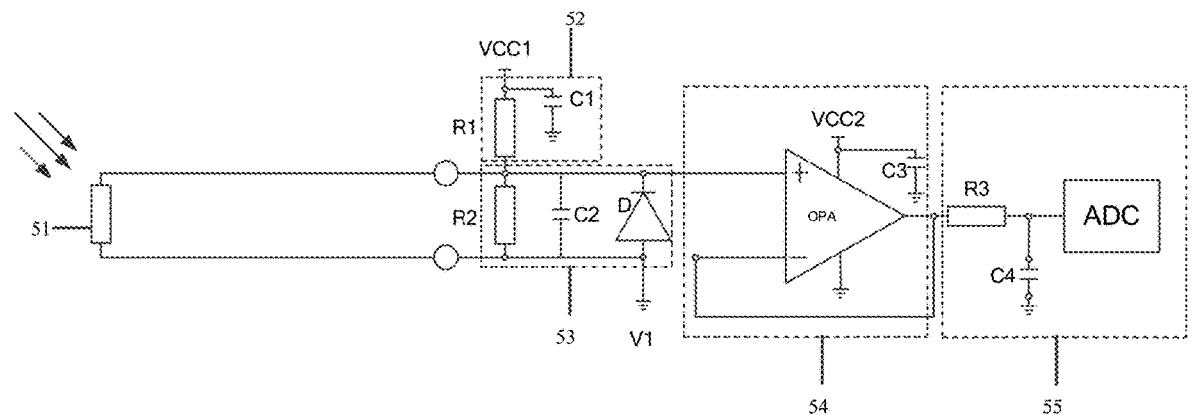
FIG. 5 illustrates a structural schematic diagram of the first light-intensity detection unit according to an embodiment of the present disclosure.

In an optional implementation, referring to FIG. 5, the photosensitive sensor 13 is a photoresistor 51, and the light-intensity detection unit may further include: a first voltage divider element 52, a shunt element 53, an amplifier element 54, and a first analog-to-digital conversion element 55.

Wherein, a first end of the photoresistor 51 is connected in series with the first voltage divider element 52, a second end is connected to a first reference voltage terminal V1; the shunt element 53 is connected in parallel with the photoresistor 51; a non-inverting input end of the amplifier element 54 is connected to the first end of the photoresistor 51, an inverting input end is connected to a first node A; and the first analog-to-digital conversion element 55 is connected to the first node A and the control unit 14, respectively. The first reference voltage terminal V1 shown in FIG. 5 is the ground terminal.

In the implementation, the first voltage divider element 52, the shunt element 53, the amplifier element 54, the first analog-to-digital conversion element 55, and the control unit 14 are integrated on the printed circuit board of the display module. In this way, the aging of the first voltage divider element 52, the shunt element 53, the amplifier element 54 and the first analog-to-digital conversion element 55 may be delayed.

Referring to FIG. 5, the first voltage divider element 52 may include a first resistor R1 and a first capacitor C1. The first resistor R1 is respectively connected to the first end of the photoresistor 51 and a voltage input terminal VCC1, a first end of the first capacitor C1 is connected to the voltage input terminal VCC1, and a second end of the first capacitor C1 is grounded.

The shunt element 53 may include a second resistor R2, a second capacitor C2, and a diode D connected in parallel with the photoresistor 51, respectively.

The amplifier element 54 includes an arithmetic amplifier, and the model may be OPT170, for example.

The first analog-to-digital conversion element 55 includes an analog-to-digital converter ADC.

In the implementation, the photoresistor 51 and the printed circuit board may be connected through a two-wire system.

Figure 6:
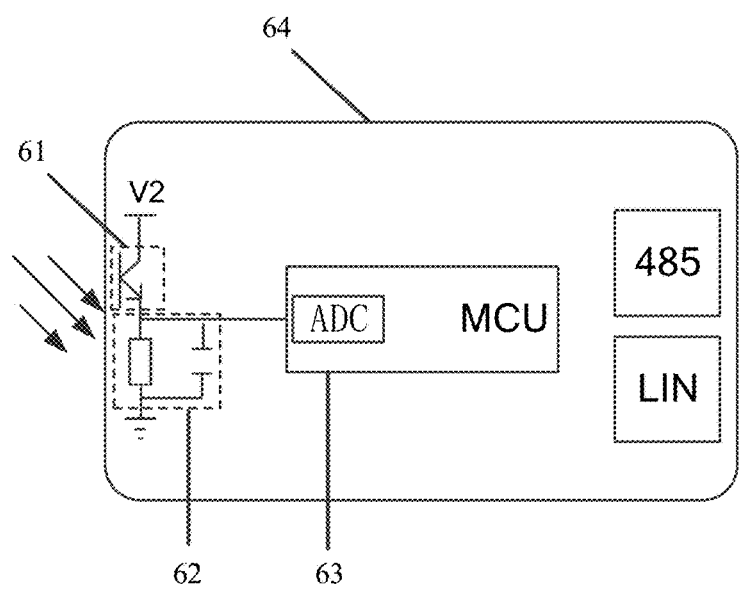
FIG. 6 illustrates a structural schematic diagram of the second light-intensity detection unit according to an embodiment of the present disclosure.

In an optional implementation, referring to FIG. 6, the photosensitive sensor 13 is a phototriode 61, and the light-intensity detection unit may further include: a second voltage divider element 62 and a second analog-to-digital conversion element 63.

Wherein, a first pole of the phototriode 61 is connected to a second reference voltage terminal V2, a second pole of the phototriode 61 is connected to the second voltage divider element 62 and the second analog-to-digital conversion element 63, respectively; and the second analog-to-digital conversion element 63 is further connected to the control unit 14.

The phototriode 61, the second voltage divider element 62, and the second analog-to-digital conversion element 63 are integrated on a photo inductance control board 64 of the display module, and the photo inductance control board 64 and the peripheral area are disposed correspondingly.

In the implementation, the second voltage divider element 62 may include a resistor R and a capacitor C connected in parallel, one end of the second voltage divider element 62 is connected to the second pole of the phototriode 61, and the other end is grounded.

The photo inductance control board 64 may provide with a micro control element MCU, the second analog-to-digital conversion element 63 may be disposed on the micro control element MCU, which is not limited in the embodiment.

Figure 7:
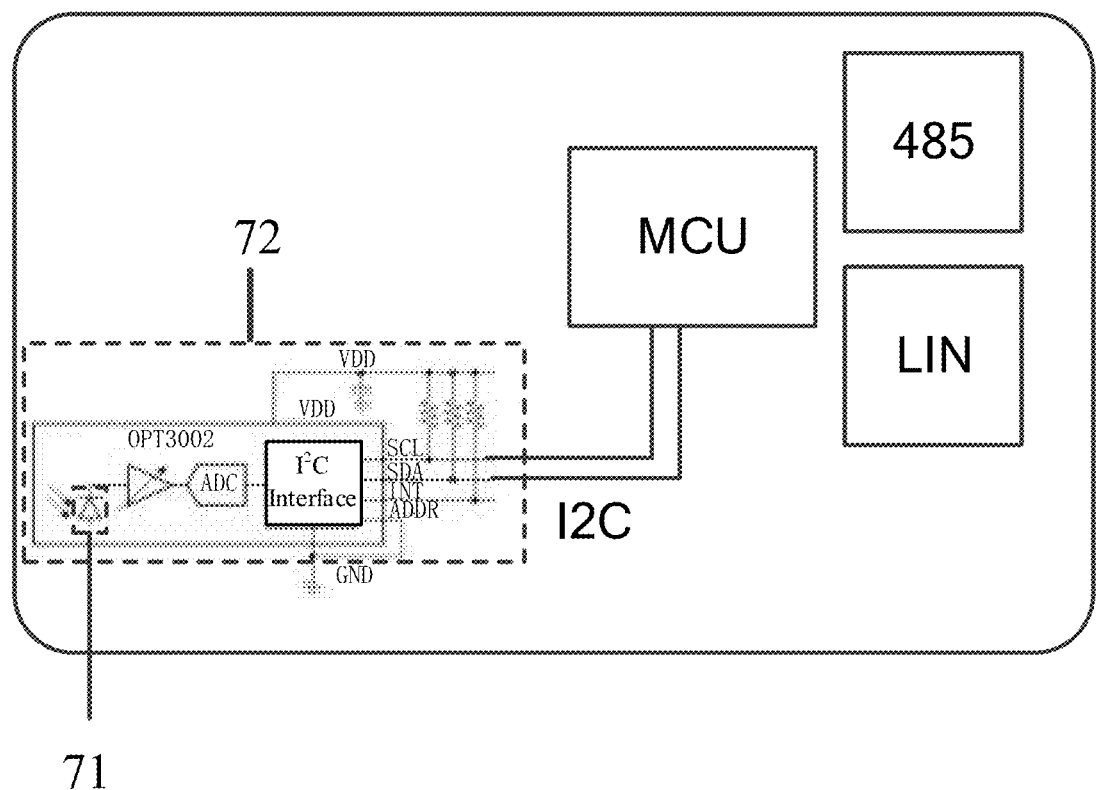
FIG. 7 illustrates a structural schematic diagram of the third light-intensity detection unit according to an embodiment of the present disclosure.

Referring to FIG. 7, the photosensitive sensor 13 may be a photodiode 71, the light-intensity detection unit may include a photo inductance integrated chip 72, the photodiode 71 is disposed on the photo inductance integrated chip 72, and the photo inductance integrated chip 72 and the peripheral area are disposed correspondingly.

In the implementation, the photo inductance integrated chip 72 may also be connected to the micro control element MCU through the I2C interface.

Figure 8:
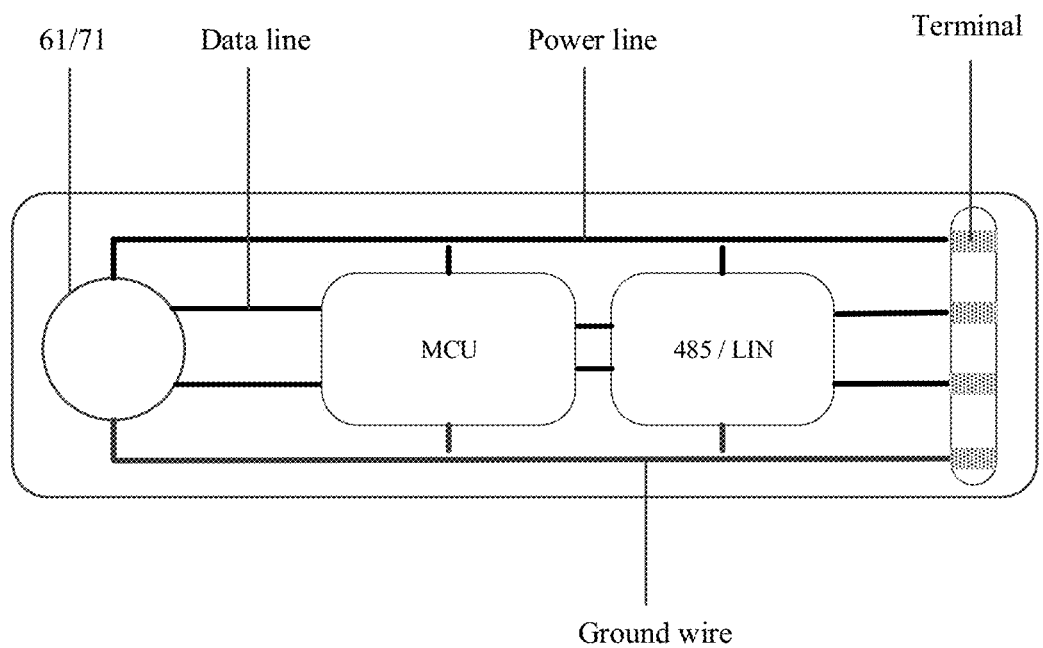
FIG. 8 illustrates an internal structural schematic diagram of a light-intensity detection unit according to an embodiment of the present disclosure.

The light-intensity detection unit and the control unit 14 are connected via a RS485 or a LIN bus, as shown in FIG. 8, the data output channel of the light-intensity detection unit is RS485 or LIN bus. The light-intensity detection unit provided in FIG. 6 and FIG. 7 outputs digital electrical signals, which may avoid the influence of different wire lengths and materials on the analog electrical signals, and improve the accuracy of incident-light intensity.

In an optional implementation, the control unit 14 may include: an arithmetic element, configured to determine a target transmittance of the dimming panel according to the incident-light intensity; and a control element, configured to output a control signal to the dimming panel according to the target transmittance.

Wherein, the arithmetic element and the control element are connected via a RS232 interface.

In specific implementation, as shown in FIG. 1 and FIG. 4, the control element may be located on the dimming control board. The arithmetic element may be located on a system on chip (SOC board for short). The dimming control board and the SOC board are disposed discretely and connected to each other, and the discrete arrangement can reduce the maintenance cost. Since the SOC board may also be used to control the display of the transparent display panel 11, by setting the arithmetic element on the SOC board, it is convenient for the SOC board to adjust the display parameters according to the incident-light intensity, which helps to further improve the display contrast.

In this embodiment, the dimming control board and the SOC board are used as two independent functional modules, and RS232 may be used for information communication between the two, so as to realize the remote dimming control of the dimming panel 12. It should be noted that the dimming control board and the SOC board may also be integrated on one control board, which is not limited in this embodiment.

In a specific implementation, the light-intensity detection unit shown in FIG. 6 and FIG. 7 requires an external power supply wire, which increases the difficulty of combining the light-intensity detection unit, the dimming panel 12, and the transparent display panel 11.

Figure 9:
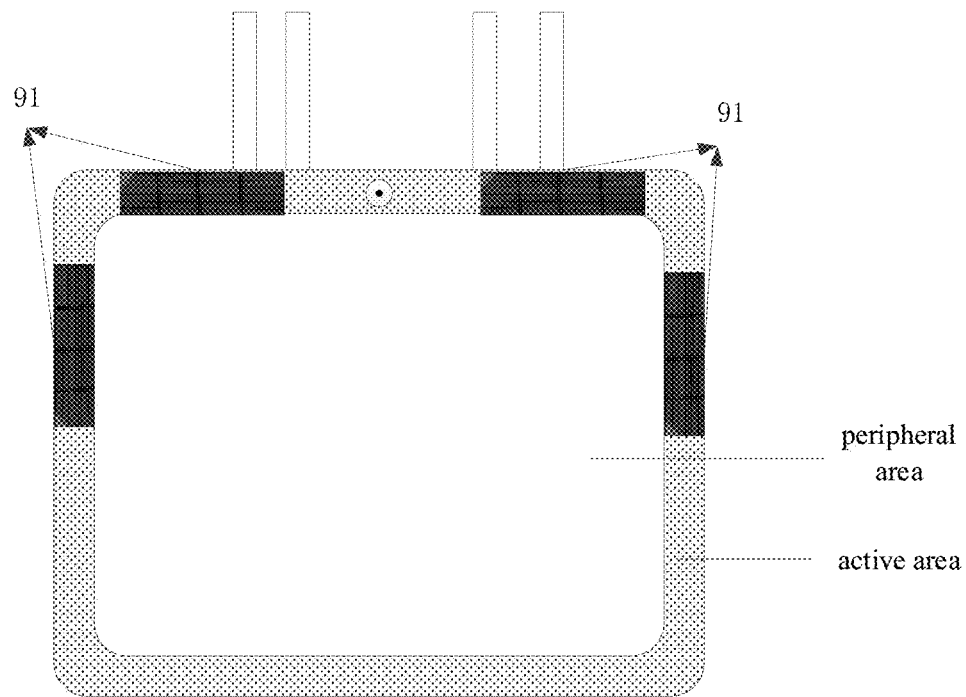
FIG. 9 illustrates a schematic diagram of the installation position of a solar cell panel according to an embodiment of the present disclosure.

In order to solve the power supply problem of the light-intensity detection unit, in an optional implementation, referring to FIG. 2, FIG. 3 and FIG. 9, the display module may also include:
  a first glass plate 21, disposed at sides of the dimming panel 12 and the photosensitive sensor 13 away from the display side; and a solar cell panel 91, disposed at a side of the first glass plate 21 away from the transparent display panel 11, disposed corresponding to the peripheral area, and configured to receive sunlight and convert a luminous energy of the sunlight into an electric energy, wherein the electric energy is used to power at least one of the followings: the transparent display panel 11, the dimming panel 12, the light-intensity detection unit, and the control unit 14.

When the photosensitive sensor 13 is disposed at the side of the dimming panel 12 away from the transparent display panel 11, as shown in FIG. 2, the first glass plate 21 is disposed at the side of the photosensitive sensor 13 away from the transparent display panel 11. When the photosensitive sensor 13 is disposed at the side of the dimming panel 12 close to the transparent display panel 11, as shown in FIG. 3, the first glass plate 21 is disposed at the side of the dimming panel 12 away from the transparent display panel 11.

In a specific implementation, the solar cell panel 91 may be disposed at the corresponding position of the peripheral area for partial installation (as shown in FIG. 9) or comprehensive installation, which is not limited in this embodiment. Optionally, when performing partial installation, the solar cell panel 91 may be installed near the top of the vehicle, as shown in FIG. 9, which helps to receive more sunlight.

Figure 10:
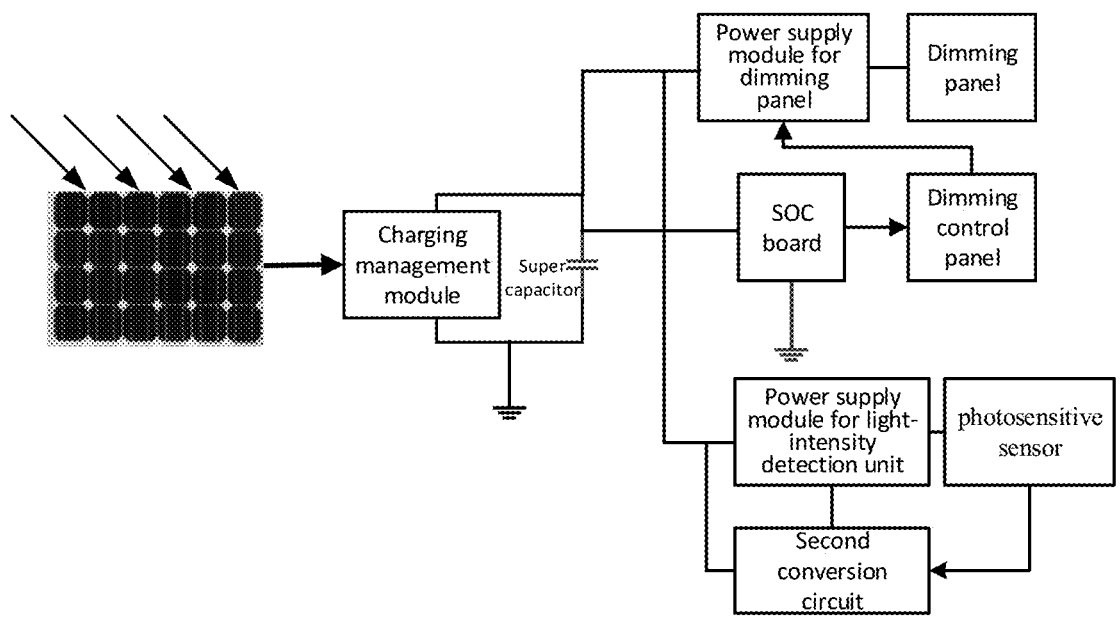
FIG. 10 illustrates a structural schematic diagram of a self-generation system according to an embodiment of the present disclosure.

In practical applications, as shown in FIG. 10, the electric energy is obtained through the solar cell panel 91, and the super capacitor or battery may be charged through the charging management module, so that the battery or the super capacitor can perform electric energy output on the display module without external power supply.

By disposing the solar cell panel 91 at the corresponding position of the peripheral area to implement the self-generation of the display module, may reduce the quantity of external leads, reduce the difficulty of combining the chips, and improve the reliability of the display module.

In order to supply power to the light-intensity detection unit, in another optional implementation, as shown in FIG. 2 and FIG. 3, the display module may also include:
  a first glass plate 21, disposed at sides of the dimming panel 12 and the photosensitive sensor 13 away from the display side;
  a second glass plate 22, disposed at a side of the transparent display panel 11 close to the display side;
  a first metal electrode disposed at a side of the first glass plate 21 close to the dimming panel 12, and disposed corresponding to the peripheral area;
  a second metal electrode disposed at a side of the second glass plate 22 close to the transparent display panel 11, and disposed corresponding to the peripheral area; and
  a temperature difference power generation sheet connected to the first metal electrode and the second metal electrode, respectively, disposed corresponding to the peripheral area, and configured to generate electric energy according to a temperature difference between the first metal electrode and the second metal electrode, wherein the electric energy is used to power at least one of the followings: the transparent display panel 11, the dimming panel 12, the light-intensity detection unit, and the control unit 14.

When the photosensitive sensor 13 is disposed at the side of the dimming panel 12 away from the transparent display panel 11, as shown in FIG. 2, the first glass plate 21 is disposed at the side of the photosensitive sensor 13 away from the transparent display panel 11.

When the photosensitive sensor 13 is disposed at the side of the dimming panel 12 close to the transparent display panel 11, as shown in FIG. 3, the first glass plate 21 is disposed at the side of the dimming panel 12 away from the transparent display panel 11.

Referring to FIG. 2 and FIG. 3, the second glass plate 22 is disposed at the side of the transparent display panel 11 away from the dimming panel 12.

Since the light-shielding function of the dimming panel 12, the temperature of the second glass plate 22 is higher than the temperature of the first glass plate 21, so metal electrode sheets are attached to the inner sides of the second glass plate 22 and the first glass plate 21, respectively, and the two metal electrode sheets are connected through the temperature difference power generation sheet. Thus, a temperature difference power generation system is constituted in this way.

In practical applications, referring to FIG. 10, the electric energy is obtained through the temperature difference power generation system, and the super capacitor or the battery may be charged through the charging management module, so that the battery or the super capacitor can perform electric energy output on the display module without external power supply.

By disposing the first metal electrode, the second metal electrode, and the temperature difference power generation sheet at the corresponding position of the peripheral area to form the temperature difference power generation system, can realize the self-generation of the display module, reduce the number of external leads, reduce the difficulty of combining the chips, and improve the reliability of the display module.

Another embodiment of the present disclosure further provides a display device, and the display device may include the display module described in any of the embodiments.

In an optional implementation, the display device may be a window or a vehicle.

Figure 11:
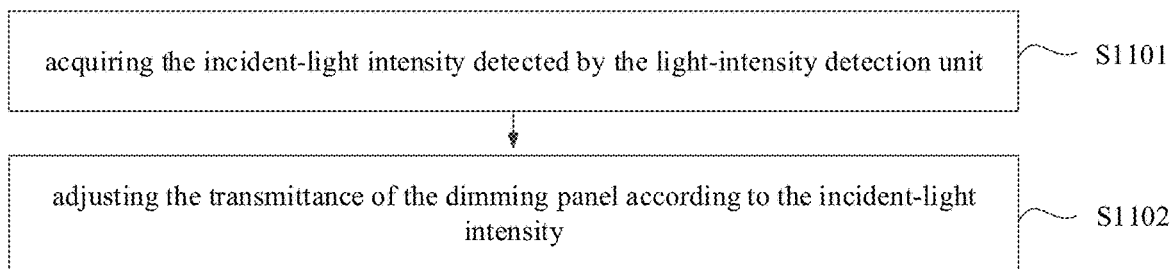
FIG. 11 illustrates a step flow chart of a control method of the display module according to an embodiment of the present disclosure.

Another embodiment of the present disclosure also provides a control method of a display module, which is applied to the display module of any embodiment. Referring to FIG. 11, the control method may include:

step S1101: acquiring the incident-light intensity detected by the light-intensity detection unit.

The execution subject of this embodiment may be the control unit.

In a specific implementation, the control unit may acquire incident-light intensity according to the predetermined cycle.

It should be noted that, the light-intensity detection unit may detect the incident-light intensity of the incident light in real time. The control unit may acquire the incident-light intensity according to the predetermined cycle.

Step S1102: adjusting the transmittance of the dimming panel according to the incident-light intensity.

In an optional implementation, as shown in FIG. 2, the photosensitive sensor 13 is disposed at a side of the dimming panel 12 away from the transparent display panel 11, the step S1102 may specifically include: determining a target transmittance corresponding to the incident-light intensity, according to a pre-stored corresponding relationship between light intensities and transmittances; and outputting a control signal to the dimming panel 12 according to the target transmittance.

In another optional implementation, as shown in FIG. 3, the photosensitive sensor 13 is disposed at a side of the dimming panel 12 close to the transparent display panel 11, the step S1102 may specifically include:

on the condition that the incident-light intensity is greater than a first preset threshold, determining that the target transmittance of the dimming panel 12 is less than a current transmittance of the dimming panel 12;

on the condition that the incident-light intensity is less than a second preset threshold, determining that the target transmittance is greater than the current transmittance;

on the condition that the incident-light intensity is less than or equal to the first preset threshold, and greater than or equal to the second preset threshold, determining that the target transmittance is the current transmittance; and outputting a control signal to the dimming panel 12 according to the target transmittance.

In an optional implementation, before the step S1101, the method may further include: acquiring a dimming instruction sent by a backstage administrator account, wherein the dimming instruction contains a specified transmittance; and adjusting the transmittance of the dimming panel 12 to the specified transmittance in response to the dimming instruction.

In the implementation, the step S1101 may specifically include: if the dimming instruction is not acquired, acquiring the incident-light intensity detected by the light-intensity detection unit.

In a specific implementation, the transmittance of the dimming panel 12 is adjusted preferentially in accordance with the specified transmittance.

In an optional implementation, before the step S1101, the method may further include: acquiring information to be played; and outputting a drive signal to the transparent display panel 11, to drive the transparent display panel 11 to display the information to be played.

Figure 12:
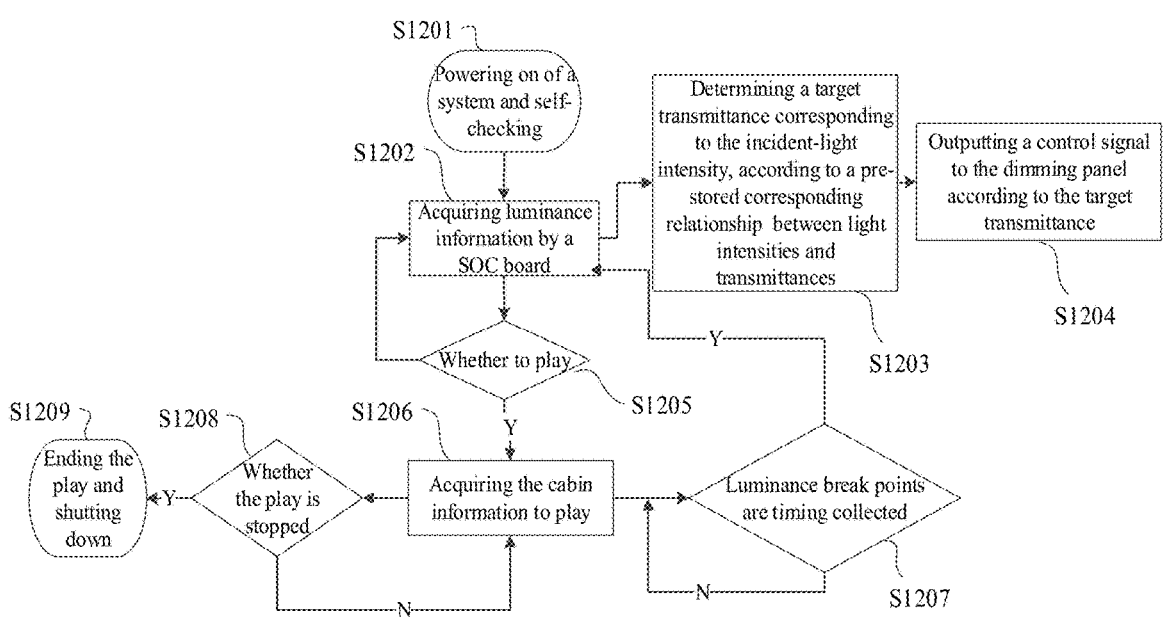
FIG. 12 illustrates a step flow chart of a specific implementation manner of a control method according to an embodiment of the present disclosure.

In a specific implementation, referring to FIG. 12, illustrates a step flow chart of a specific implementation manner of a control method. The control method may specifically include the following steps:

step S1201: powering on of a system and self-checking;

step S1202: acquiring luminance information by a SOC board; wherein, the luminance information is an incident-light intensity;

step S1203: determining a target transmittance corresponding to the incident-light intensity, according to a pre-stored corresponding relationship between light intensities and transmittances;

step S1204: outputting a control signal to the dimming panel according to the target transmittance;

step S1205: determining whether to play cabin information? If yes, performing the step S1206; if no, repeating the step S1202;

step S1206: acquiring the cabin information to play;

step S1207: determining whether luminance break points are timing collected? If yes, repeating the step S1202; if no, waiting and repeating the step S1207;

step S1208: determining whether the play is stopped? If yes, performing the step S1209; if no, repeating the step S1206;

step S1209: ending the play and shutting down.

Figure 13:
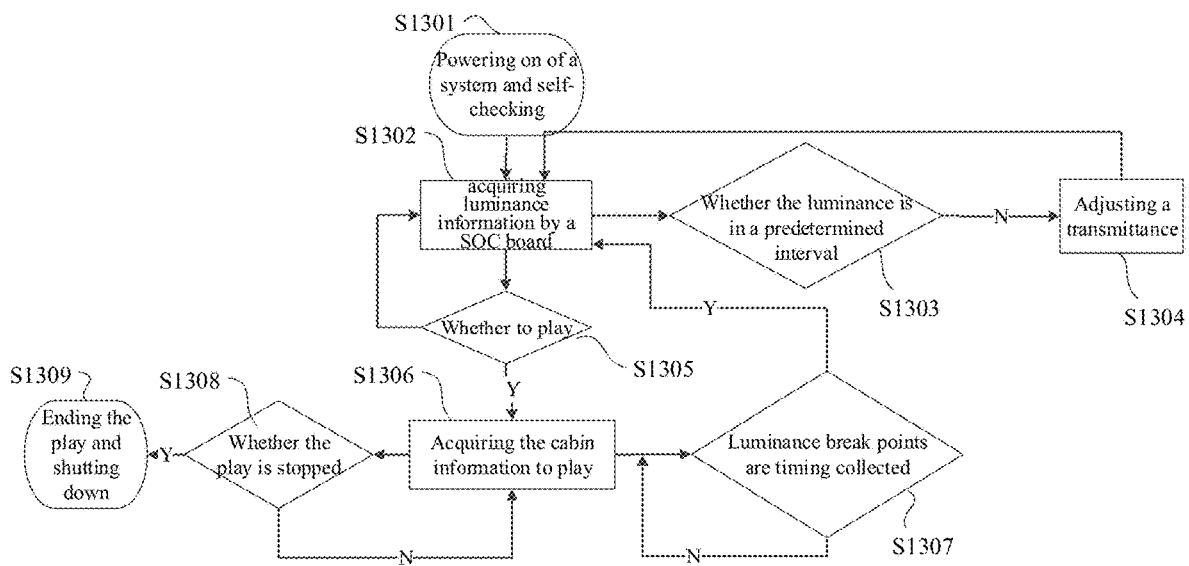
FIG. 13 illustrates a step flow chart of a specific implementation manner of another control method according to an embodiment of the present disclosure.

In a specific implementation, referring to FIG. 13, illustrates a step flow chart of another specific implementation manner of a control method. The control method may specifically include the following steps:

step S1301: powering on of a system and self-checking;

step S1302: acquiring luminance information by a SOC board; wherein, the luminance information is an incident-light intensity;

step S1303: determining whether the luminance is in a predetermined interval; if not, performing the step S1304;

step S1304: adjusting a transmittance, and repeating the step S1302;

step S1305: determining whether to play cabin information? If yes, performing the step S1306; if no, repeating the step S1302;

step S1306: acquiring the cabin information to play;

step S1307: determining whether luminance break points are timing collected? If yes, repeating the step S1302; if no, waiting and repeating the step S1307;

step S1308: determining whether the play is stopped? If yes, performing the step S1309; if no, repeating the step S1306;

step S1309: ending the play and shutting down.

In the two flow charts of FIG. 12 and FIG. 13, two major threads are mainly involved. One of the threads is mainly for the SOC board to send and receive information and management of the play, mainly to play the cabin information, real-time play of the relevant cabin information to the passengers, while taking into account the monitoring of the running status; the other thread is mainly the control of the dimming panel transmittance.

Regarding the control method in this embodiment, the specific implementation of each step has been described in detail in the embodiment of the display module, no detailed explanation will be given here.

The embodiment of the present disclosure provides a control method of a display module, a display module, and a display device, wherein, the display module includes: a transparent display panel comprising an active area and a peripheral area located on a periphery of the active area, wherein the transparent display panel has a display side; a dimming panel disposed at a side of the transparent display panel away from the display side; a light-intensity detection unit comprising a photosensitive sensor, wherein the photosensitive sensor is disposed at a side of the transparent display panel away from the display side and disposed corresponding to the peripheral area, and the light-intensity detection unit is configured to detect an incident-light intensity of an incident light; and a control unit connected to the light-intensity detection unit and the dimming panel, respectively, and configured to adjust a transmittance of the dimming panel according to the incident-light intensity. In the technical solution of the present disclosure, by disposing the photosensitive sensor at the back of the transparent display panel, the incident-light intensity of the incident light on the back of the transparent display panel may be detected, and the transmittance of the dimming panel may be adjusted according to the incident-light intensity. Moreover, since the dimming panel is disposed at the back of the transparent display panel, by adjusting the transmittance of the dimming panel, the intensity of the light incident on the transparent display panel can be ensured to remain stable, thereby improving the stability of the display contrast of the transparent display panel.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles, or devices that include a series of elements do not only include those elements, but also include other elements that are not explicitly listed, or include the elements that are inherent to such processes, methods, articles, or devices. Unless further limitation is set forth, an element defined by the wording "comprising a . . . " does not exclude additional same element in the process, method, article, or device comprising the element.

The control method of the display module, the display module, and the display device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The "one embodiment", "an embodiment" or "one or more embodiments" referred to herein means that a specific feature, structure, or characteristic described in conjunction with the embodiment is included in at least one embodiment of the present disclosure. In addition, please note that the word examples "in one embodiment" here do not necessarily all refer to the same embodiment.

In the specification provided here, a lot of specific details are explained. However, it can be understood that the embodiments of the present disclosure can be practiced without these specific details. In some instances, well-known methods, structures, and technologies are not shown in detail, so as not to obscure the understanding of this specification.

In the claims, any reference signs placed between parentheses should not be constructed as a limitation to the claims. The word "comprising" does not exclude the presence of elements or steps not listed in the claims. The word "a" or "an" preceding an element does not exclude the presence of multiple such elements. The present disclosure can be realized by means of hardware including several different elements and by means of a suitably programmed computer. In the unit claims that list several devices, several of these devices may be embodied in the same hardware item. The use of the words first, second, and third, etc. do not indicate any order. These words can be interpreted as names.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: the technical solutions recorded in the foregoing embodiments are modified, or some of the technical features are equivalently replaced; these modifications or replacements do not cause the essence of the corresponding technical solutions to deviate from the spirit and scope of the technical solutions of the embodiments of the present disclosure.

The invention claimed is:

1. A display module comprising:
a transparent display panel comprising an active area and a peripheral area located on a periphery of the active area, wherein the transparent display panel includes a display side;
a dimming panel disposed at a side of the transparent display panel away from the display side;
a light-intensity detection unit comprising a photosensitive sensor, wherein the photosensitive sensor is disposed at a side of the transparent display panel away from the display side and disposed corresponding to the peripheral area, and the light-intensity detection unit is configured to detect an incident-light intensity of an incident light; and
a control unit connected to the light-intensity detection unit and the dimming panel, respectively, and configured to adjust a transmittance of the dimming panel according to the incident-light intensity,
wherein the photosensitive sensor is a photoresistor, and the light-intensity detection unit further comprises: a first voltage divider element, a shunt element, an amplifier element, and a first analog-to-digital conversion element;
wherein, a first end of the photoresistor is connected in series with the first voltage divider element, a second end is connected to a first reference voltage terminal; the shunt element is connected in parallel with the photoresistor; a non-inverting input end of the amplifier element is connected to the first end of the photoresistor, an inverting input end of the amplifier element is connected to a first node; and the first analog-to-digital conversion element is connected to the first node and the control unit, respectively; and the first voltage divider element, the shunt element, the amplifier element, the first analog-to-digital conversion element, and the control unit are integrated on a printed circuit board of the display module.

2. The display module according to claim 1, wherein the photosensitive sensor is disposed at a side of the dimming panel away from the transparent display panel.

3. The display module according to claim 1, wherein the control unit comprises:
an arithmetic element, configured to determine a target transmittance of the dimming panel according to the incident-light intensity; and
a control element, configured to output a control signal to the dimming panel according to the target transmittance;
wherein, the arithmetic element and the control element are connected via a RS232 interface.

4. The display module according to claim 1, wherein the display module further comprises:
a first glass plate disposed at sides of the dimming panel and the photosensitive sensor away from the display side; and
a solar cell panel disposed at a side of the first glass plate away from the transparent display panel, disposed corresponding to the peripheral area, and configured to receive sunlight and convert a luminous energy of the sunlight into an electric energy, wherein the electric energy is used to power at least one of the followings: the transparent display panel, the dimming panel, the light-intensity detection unit, and the control unit.

5. The display module according to claim 1, wherein the display module further comprises:
a first glass plate disposed at sides of the dimming panel and the photosensitive sensor away from the display side;
a second glass plate disposed at a side of the transparent display panel close to the display side;
a first metal electrode disposed at a side of the first glass plate close to the dimming panel, and disposed corresponding to the peripheral area;
a second metal electrode disposed at a side of the second glass plate close to the transparent display panel, and disposed corresponding to the peripheral area; and
a temperature difference power generation sheet connected to the first metal electrode and the second metal electrode, respectively, disposed corresponding to the peripheral area, and configured to generate electric energy according to a temperature difference between the first metal electrode and the second metal electrode, wherein the electric energy is used to power at least one of the followings: the transparent display panel, the dimming panel, the light-intensity detection unit, and the control unit.

6. A display device comprising the display module according to claim 1, wherein the display device is a window or a vehicle.

7. The display device according to claim 6, wherein the photosensitive sensor is disposed at a side of the dimming panel away from the transparent display panel.

8. The display module according to claim 1, wherein the photosensitive sensor is disposed at a side of the dimming panel close to the transparent display panel.

9. A display module comprising:
a transparent display panel comprising an active area and a peripheral area located on a periphery of the active area, wherein the transparent display panel includes a display side;
a dimming panel disposed at a side of the transparent display panel away from the display side;
a light-intensity detection unit comprising a photosensitive sensor, wherein the photosensitive sensor is disposed at a side of the transparent display panel away from the display side and disposed corresponding to the peripheral area, and the light-intensity detection unit is configured to detect an incident-light intensity of an incident light; and
a control unit connected to the light-intensity detection unit and the dimming panel, respectively, and configured to adjust a transmittance of the dimming panel according to the incident-light intensity,
wherein the photosensitive sensor is a phototriode, and the light-intensity detection unit further comprises: a second voltage divider element and a second analog-to-digital conversion element;
wherein, a first pole of the phototriode is connected to a second reference voltage terminal, a second pole of the phototriode is connected to the second voltage divider element and the second analog-to-digital conversion element, respectively; and the second analog-to-digital conversion element is further connected to the control unit; and
the phototriode, the second voltage divider element and the second analog-to-digital conversion element are integrated on a photo inductance control board of the display module, and the photo inductance control board and the peripheral area are disposed correspondingly.

10. The display module according to claim 9, wherein the light-intensity detection unit and the control unit are connected via a RS485 or a LIN bus.

11. A display device, wherein the display device comprises the display module according to claim 9.

12. The display module according to claim 9, wherein the control unit comprises:
an arithmetic element, configured to determine a target transmittance of the dimming panel according to the incident-light intensity; and
a control element, configured to output a control signal to the dimming panel according to the target transmittance;
wherein, the arithmetic element and the control element are connected via a RS232 interface.

13. The display module according to claim 9, wherein the display module further comprises:
a first glass plate disposed at sides of the dimming panel and the photosensitive sensor away from the display side; and
a solar cell panel disposed at a side of the first glass plate away from the transparent display panel, disposed corresponding to the peripheral area, and configured to receive sunlight and convert a luminous energy of the sunlight into an electric energy, wherein the electric energy is used to power at least one of the followings: the transparent display panel, the dimming panel, the light-intensity detection unit, and the control unit.

14. The display module according to claim 9, wherein the display module further comprises:
- a first glass plate disposed at sides of the dimming panel and the photosensitive sensor away from the display side;
- a second glass plate disposed at a side of the transparent display panel close to the display side;
- a first metal electrode disposed at a side of the first glass plate close to the dimming panel, and disposed corresponding to the peripheral area;
- a second metal electrode disposed at a side of the second glass plate close to the transparent display panel, and disposed corresponding to the peripheral area; and
- a temperature difference power generation sheet connected to the first metal electrode and the second metal electrode, respectively, disposed corresponding to the peripheral area, and configured to generate electric energy according to a temperature difference between the first metal electrode and the second metal electrode, wherein the electric energy is used to power at least one of the followings: the transparent display panel, the dimming panel, the light-intensity detection unit, and the control unit.

15. A control method of a display module, wherein the display module comprising:
- a transparent display panel comprising an active area and a peripheral area located on a periphery of the active area, wherein the transparent display panel includes a display side;
- a dimming panel disposed at a side of the transparent display panel away from the display side;
- a light-intensity detection unit comprising a photosensitive sensor, wherein the photosensitive sensor is disposed at a side of the transparent display panel away from the display side and disposed corresponding to the peripheral area, and the light-intensity detection unit is configured to detect an incident-light intensity of an incident light; and
- a control unit connected to the light-intensity detection unit and the dimming panel, respectively, and configured to adjust a transmittance of the dimming panel according to the incident-light intensity, and the control method comprises:

acquiring the incident-light intensity detected by the light-intensity detection unit; and adjusting the transmittance of the dimming panel according to the incident-light intensity;

wherein on the condition that the photosensitive sensor is disposed at a side of the dimming panel close to the transparent display panel, the step of adjusting the transmittance of the dimming panel according to the incident-light intensity comprises:

on the condition that the incident-light intensity is greater than a first preset threshold, determining that the target transmittance of the dimming panel is less than a current transmittance of the dimming panel;

on the condition that the incident-light intensity is less than a second preset threshold, determining that the target transmittance is greater than the current transmittance;

on the condition that the incident-light intensity is less than or equal to the first preset threshold, and greater than or equal to the second preset threshold, determining that the target transmittance is the current transmittance; and outputting a control signal to the dimming panel according to the target transmittance.

16. The control method according to claim 15, wherein on the condition that the photosensitive sensor is disposed at a side of the dimming panel away from the transparent display panel, the step of adjusting the transmittance of the dimming panel according to the incident-light intensity comprises:

determining a target transmittance corresponding to the incident-light intensity, according to a pre-stored corresponding relationship between light intensities and transmittances; and outputting a control signal to the dimming panel according to the target transmittance.

17. The control method according to claim 15, wherein the step of acquiring the incident-light intensity detected by the light-intensity detection unit comprises:

acquiring the incident-light intensity according to a predetermined cycle.

18. The control method according to claim 15, wherein before the step of acquiring the incident-light intensity detected by the light-intensity detection unit, the method further comprises:

acquiring a dimming instruction sent by a backstage administrator account, wherein the dimming instruction contains a specified transmittance; and adjusting the transmittance of the dimming panel to the specified transmittance in response to the dimming instruction;

the step of acquiring the incident-light intensity detected by the light-intensity detection unit comprises:

responsive to not acquiring the dimming instruction, acquiring the incident-light intensity detected by the light-intensity detection unit.

19. The control method according to claim 15, wherein before the step of acquiring the incident-light intensity detected by the light-intensity detection unit, the method further comprises:

acquiring information to be played; and outputting a drive signal to the transparent display panel, to drive the transparent display panel to display the information to be played.

* * * * *